United States Patent
Bang

(10) Patent No.: US 7,943,476 B2
(45) Date of Patent: May 17, 2011

(54) STACK CAPACITOR IN SEMICONDUCTOR DEVICE AND METHOD FOR FABRICATING THE SAME INCLUDING ONE ELECTRODE WITH GREATER SURFACE AREA

(75) Inventor: Ki-Wan Bang, Cheongju-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 287 days.

(21) Appl. No.: 12/211,122

(22) Filed: Sep. 16, 2008

(65) Prior Publication Data
US 2009/0096062 A1      Apr. 16, 2009

(30) Foreign Application Priority Data
Oct. 16, 2007   (KR) .................. 10-2007-0103974

(51) Int. Cl.
*H01L 21/20* (2006.01)
*H01L 21/4763* (2006.01)
(52) U.S. Cl. ........................ 438/396; 438/618
(58) Field of Classification Search .................. 438/396, 438/618; 257/E29.343, E21.008
See application file for complete search history.

(56) References Cited

U.S. PATENT DOCUMENTS

| 5,973,908 | A | 10/1999 | Saia et al. |
| 6,838,717 | B1 | 1/2005 | Yen et al. |
| 6,949,442 | B2 * | 9/2005 | Barth et al. ............. 438/396 |
| 2005/0121744 | A1 | 6/2005 | Chang et al. |
| 2005/0285226 | A1 | 12/2005 | Lee |
| 2007/0111496 | A1 * | 5/2007 | Won ............................. 438/597 |

FOREIGN PATENT DOCUMENTS

| CN | 1771603 | 5/2006 |
| KR | 10-2006-0078259 | 5/2006 |
| KR | 10-2007-0052484 | 5/2007 |

* cited by examiner

*Primary Examiner* — William M. Brewster
(74) *Attorney, Agent, or Firm* — Sher & Vaughn, PLLC

(57) ABSTRACT

A stack capacitor in a semiconductor device includes a first capacitor formed on and/or over a semiconductor substrate and a second capacitor formed on and/or over the first capacitor. The first and second capacitors each have a multi-layer laminated structure which includes a lower electrode, a capacitor dielectric layer and an upper electrode. At least two of the lower electrodes and the upper electrodes are arranged vertically with respect to each other to have the same width and/or surface area.

10 Claims, 4 Drawing Sheets

*-Related Art-*

STACK CAPACITOR IN SEMICONDUCTOR DEVICE AND METHOD FOR FABRICATING THE SAME INCLUDING ONE ELECTRODE WITH GREATER SURFACE AREA

The present application claims priority under 35 U.S.C. §119 to Korean Patent Application No. 10-2007-0103974 (filed on Oct. 16, 2007), which is hereby incorporated by reference in its entirety.

BACKGROUND

In the field of high speed performance logic circuits, there is current development and research for large-capacity capacitors. For large-capacity capacitors having a polysilicon/insulator/polysilicon (PIP) structure, since conductive polysilicon is used for upper and lower electrodes, oxidation occurs at an interface between the upper electrode and a dielectric layer and also at an interface between the lower electric and the dielectric layer. A native oxide is formed as a result of the oxidation, thereby causing a problem of reduction in the overall size of the capacitance. To solve such a problem, a metal/insulator/metal (MIM) structure has been applied to the capacitor. The MIM structure capacitor is generally employed by high-quality semiconductor devices requiring a high Q-value since the MIM structure capacitor does not have a parasitic capacitance therein formed by depletion. In addition, by employing a stack structure of the capacitor from a single layer to multiple layers, the large-capacity capacitance can be guaranteed.

Figure 1:
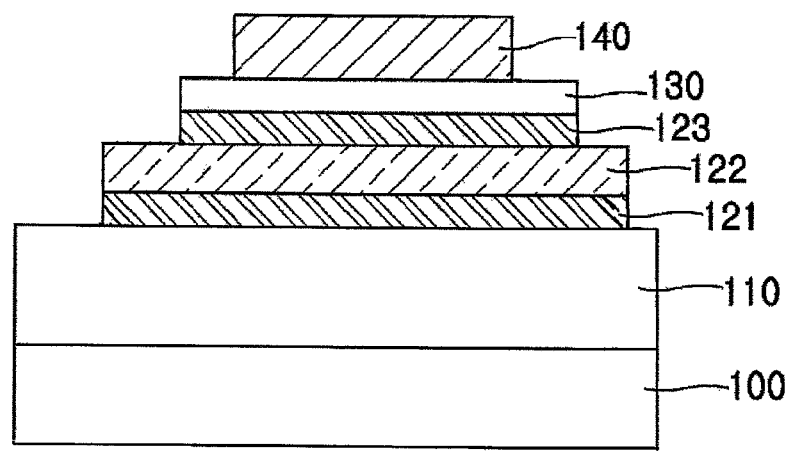

As illustrated in example FIG. 1, a stack MIM capacitor may be structured in a manner that a first capacitor and a second capacitor are deposited on and/or over a semiconductor substrate. The first capacitor may have a laminated structure including first lower electrode 110 as a metal layer on and/or over semiconductor substrate 100, first dielectric layer 121 as a dielectric layer formed on and/or over first lower electrode 110, and first upper electrode 122 as a metal layer formed on and/or over first dielectric layer 121. The second capacitor may include second lower electrode 123 as a metal layer formed on and/or over first upper electrode 122, second dielectric layer 130 as a dielectric layer formed on and/or over second lower electrode 123, and second upper electrode 140 as a metal layer formed on and/or over second dielectric layer 130.

Because first upper electrode 122 of the first capacitor is formed on and/or over a smaller area than first lower electrode 110, areas of those two electrodes do not correspond to each other. Therefore, when the electrodes of the first capacitor have different surface areas, the number of fabrication processes is increased in order to fabricate and apply different masks. Furthermore, since the second capacitor also includes two electrodes having different surface areas, the number of processes is further increased in comparison with in a single-layer capacitor, thereby deteriorating the fabrication efficiency. Also, the capacitance may be deteriorated.

SUMMARY

Embodiments relate to a method for fabricating a semiconductor device, and more particularly, to a stack capacitor in the semiconductor device and a method for fabricating the same.

Embodiments relate to a stack capacitor in a semiconductor device and a method for fabricating the same that prevents deterioration of the capacitance.

Embodiments relate to a stack capacitor in a semiconductor device that may include at least one of the following: a first capacitor formed on and/or over a semiconductor substrate, the first capacitor having a laminated structure including a first lower electrode, a first capacitor dielectric layer, and a first upper electrode; and a second capacitor formed on and/or over the first capacitor, the second capacitor having a laminated structure including a second lower electrode, a second capacitor dielectric layer, and a second upper electrode, wherein at least two of the first lower electrode, the first upper electrode, the second lower electrode and the second upper electrode are arranged vertically to each other to have the same surface area.

Embodiments relate to a method of fabricating a stack capacitor of a semiconductor device that may include at least one of the following steps: forming a first capacitor on and/or over a semiconductor substrate to have a laminated structure sequentially including a first lower electrode, a first capacitor dielectric layer, and a first upper electrode; and then forming a second capacitor on and/or over the first capacitor to have a laminated structure sequentially including a second lower electrode, a second capacitor dielectric layer, and a second upper electrode, wherein at least two of the first lower electrode, the first upper electrode, the second lower electrode and the second upper electrode are arranged vertically to each other to have the same surface area.

Embodiments relate to a semiconductor device that may include at least one of the following: a semiconductor substrate; a first capacitor formed over the semiconductor substrate and having a laminated structure including a first lower electrode, a first capacitor dielectric layer and a first upper electrode; and a second capacitor formed over the first capacitor and having a laminated structure including a second lower electrode, a second capacitor dielectric layer and a second upper electrode. In accordance with embodiments, at least two of the first lower electrode, the first upper electrode, the second lower electrode and the second upper electrode are arranged vertically with respect to each other to have the same surface area.

Embodiments relate to a method of fabricating a semiconductor device that may include at least one of the following steps: forming a first capacitor including a first lower electrode, a first capacitor dielectric layer and a first upper electrode over a semiconductor substrate; and then forming a second capacitor including a second lower electrode, a second capacitor dielectric layer and a second upper electrode over the first capacitor. In accordance with embodiments, at least two of the first lower electrode, the first upper electrode, the second lower electrode and the second upper electrode are arranged vertically stacked with respect to each other to have the same surface area.

Embodiments relate to a method that may include at least one of the following steps: forming a lower metal line over a semiconductor substrate; and then forming a first capacitor connected to the lower metal line, the first capacitor including a first lower electrode, a first upper electrode and a first capacitor dielectric layer interposed between the first lower electrode and the first upper electrode; and then forming a second capacitor connected to the first capacitor, the second capacitor including a second lower electrode, a second upper electrode and a second capacitor dielectric layer interposed between the second lower electrode and the second upper electrode; and then simultaneously forming a first upper contact connected to the second lower electrode, a second upper contact connected to the second upper electrode, and a third upper contact connected to the lower metal line.

DRAWINGS

Example FIG. 1 illustrates a stack MIM capacitor.

Example FIGS. 2 to 8 illustrate a series of processes for fabricating a stack capacitor in a semiconductor device in accordance with embodiments.

DESCRIPTION

Reference will now be made in detail to embodiments, examples of which are illustrated in the accompanying drawings. Wherever possible, the same reference numbers will be used throughout the drawings to refer to the same or like parts.

Figure 2:
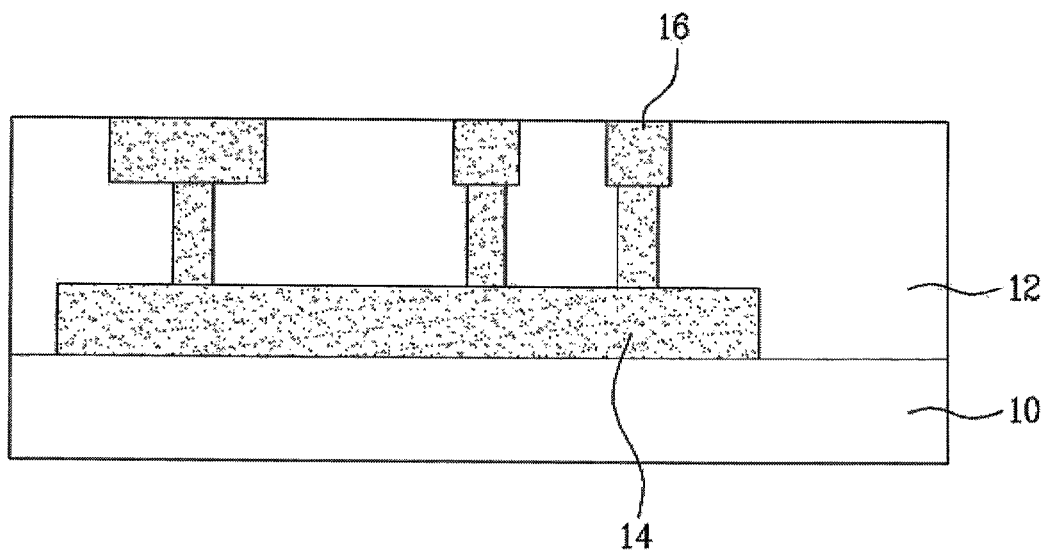

As illustrated in example FIG. 2, lower metal line 14 is formed on and/or over semiconductor substrate 10 by preparing a metal layer on and/or over substrate 10 and patterning the metal layer. First interlayer dielectric 12 is formed on and/or over substrate 10 formed with lower metal line 14. A plurality of lower contacts 16 are formed in first interlayer dielectric 12 to be in connection with lower metal line 14. For example, after a first photoresist pattern is formed on and/or over first interlayer dielectric 12 through photolithograpy, first interlayer dielectric 12 is selectively etched using the first photoresist pattern as a mask, thereby forming via holes and trenches therein. After the first photoresist pattern is removed, a metallic material is embedded in the via holes and the trenches, thereby forming lower contacts 16. Various devices including a transistor may be further formed on and/or over substrate 10 using general semiconductor fabrication processes. In such a case, lower metal line 14 may be connected to the transistor.

Figure 3:
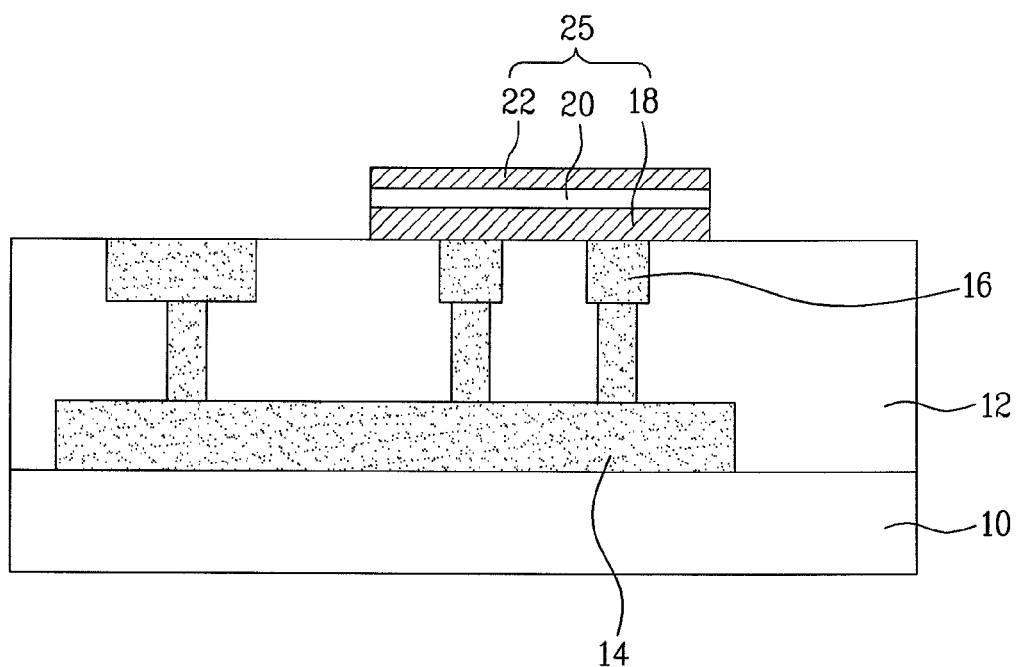

As illustrated in example FIG. 3, first capacitor 25, being connected to some of the plurality of lower contacts 16, is formed on and/or over first interlayer dielectric 12. More specifically, a first metal layer, a first dielectric layer, and a second metal layer are sequentially formed on and/or over first interlayer dielectric 12, and a second photoresist pattern is formed by performing exposure and development with respect to the second metal layer using a first mask. The first metal layer and the second metal layer may be composed of any one of tungsten (W), aluminum (Al), tantalum (Ta), and tantalum nitride (TaN). The first dielectric layer may be composed of any one of silicon nitride (SiN), and silicon oxide (SiO$_2$). Next, the first metal layer, the first dielectric layer and the second metal layer are etched in sequence using the second photoresist pattern as an etching mask, thereby obtaining first lower electrode 18, first capacitor dielectric layer 20, and first upper electrode 22. Thus, fabrication of first capacitor 25 including first lower electrode 18, first capacitor dielectric layer 20, and first upper electrode 22 is completed.

Figure 4:
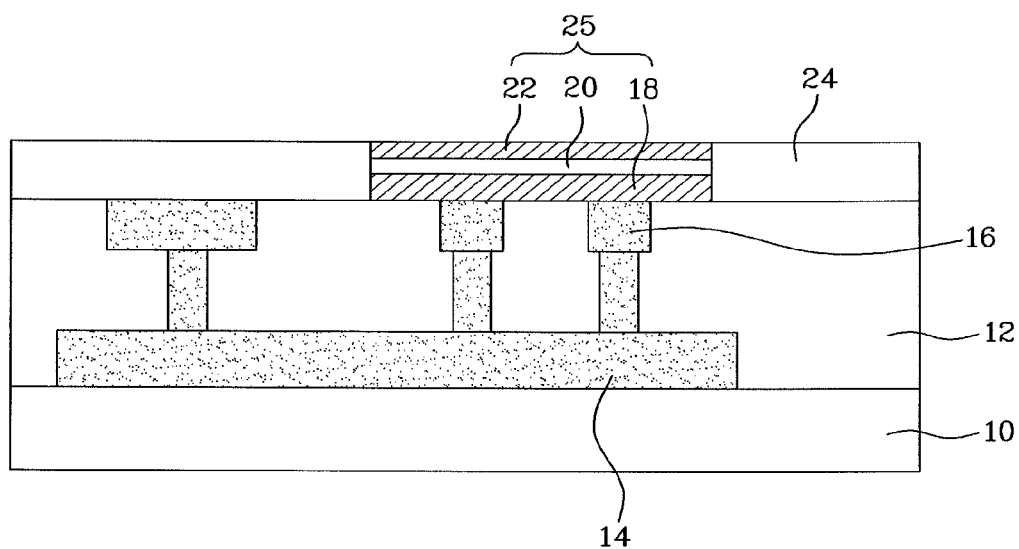

As illustrated in example FIG. 4, after a dielectric layer is formed on and/or over the whole surface of first capacitor 25, planarization such as chemical mechanical planarization (CMP) is then performed until first upper electrode 22 is exposed. Accordingly, second interlayer dielectric 24 is formed.

Figure 5:
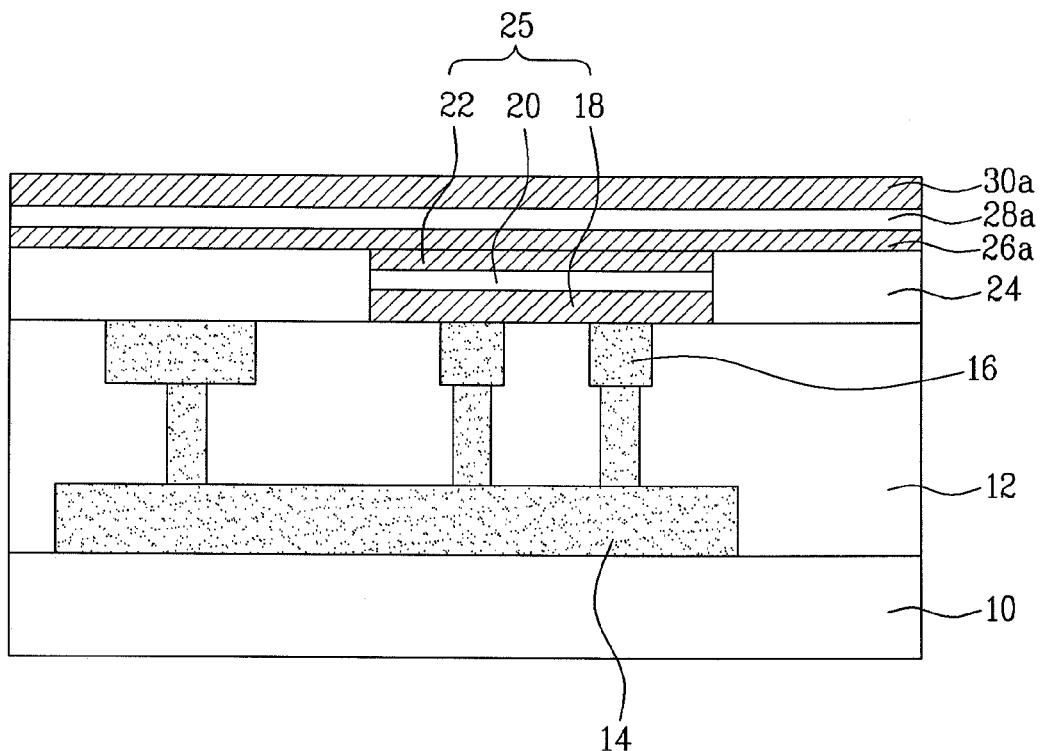

As illustrated in example FIG. 5, third metal layer 26a, second dielectric layer 28a and fourth metal layer 30a are formed in sequence on and/or over the whole surface of second interlayer dielectric 24 and first upper electrode 22. Third metal layer 26a and fourth metal layer 30a may be composed of any one of tungsten (W), aluminum (Al), tantalum (Ta), and tantalum nitride (TaN). Second dielectric layer 28a may be composed of any one of silicon nitride (SiN), and silicon oxide (SiO$_2$).

Figure 6:
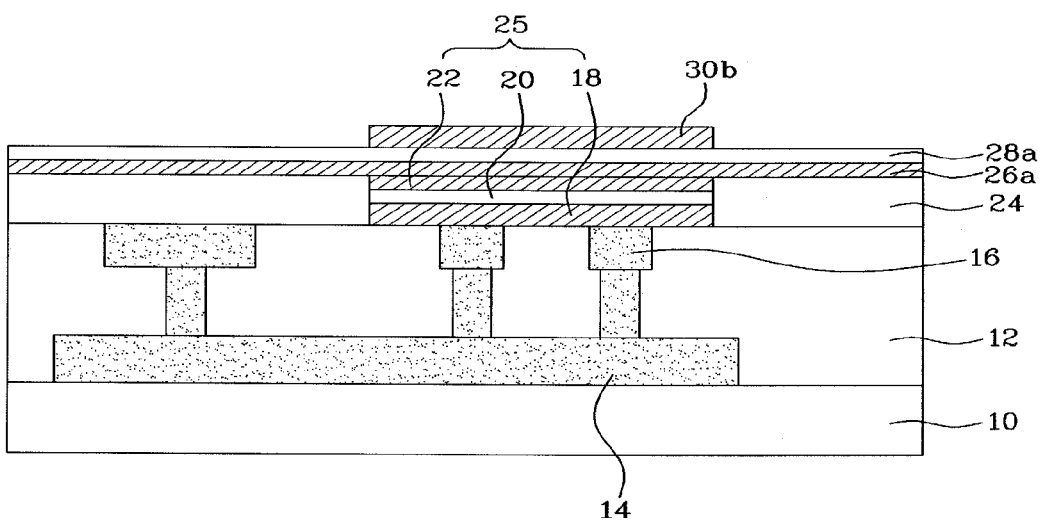

As illustrated in example FIG. 6, a third photoresist pattern may then be formed on and/or over fourth metal layer 30a using the first mask used to form first capacitor 25. Then, second upper electrode 30b is formed by performing etching with respect only to fourth metal layer 30a, with the third photoresist pattern used as an etching mask. The third photoresist pattern is removed after second upper electrode 30b is formed. The first mask used in forming first lower electrode 18 and first upper electrode 22 of first capacitor 25 is still used in forming second upper electrode 30b of second capacitor 35. As a result, electrodes 18, 22 and 30b can be formed to have the same width and/or surface area as well as being vertically arranged.

Figure 7:
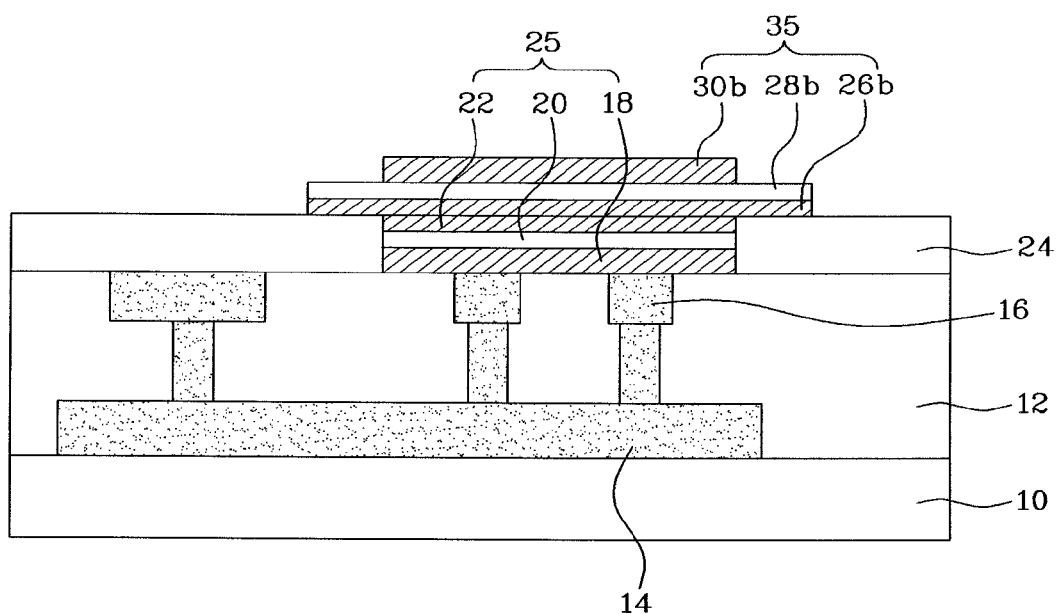

As illustrated in example FIG. 7, a fourth photoresist pattern may then be formed on and/or over second dielectric layer 28a formed with second upper electrode 30b by performing exposure and development using a second mask. The fourth photoresist pattern may be formed with a greater width and/or area than the second and the third photoresist patterns. In essence, the fourth photoresist pattern covers not only second upper electrode 30b but also the surface of second dielectric layer 28a formed around second upper electrode 30b. For example, the fourth photoresist pattern may cover a width and/or area around within the same distance from second upper electrode 30b. Second dielectric layer 28a is etched using the fourth photoresist pattern as an etching mask, thereby forming second capacitor dielectric layer 28b having a greater width and/or surface area than second upper electrode 30b. After etching second dielectric layer 28a, third metal layer 26a is etched using the fourth photoresist pattern as an etching mask, thereby forming second lower electrode 26b having a greater width and/or surface area than second upper electrode 30b. Second capacitor dielectric layer 28b and second lower electrode 26b are arranged vertically to each other, having the same width and/or surface area. Second lower electrode 26b is in contact with first upper electrode 22. Thus, second capacitor 35 is formed including second lower electrode 26b, second capacitor dielectric layer 28b and second upper electrode 30b.

Figure 8:
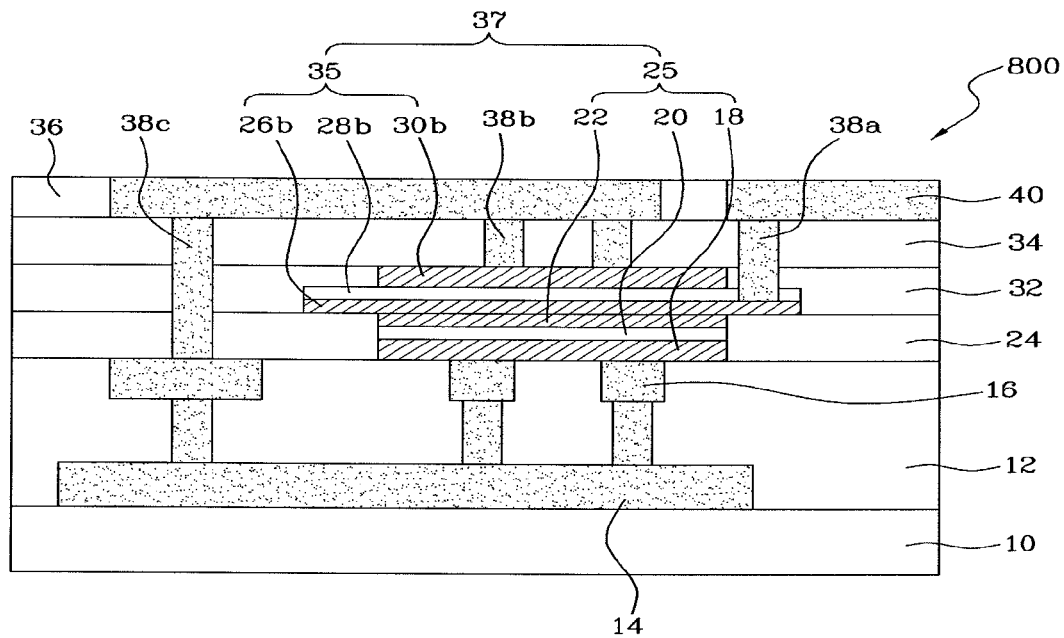

As illustrated in example FIG. 8, a dielectric layer is formed on and/or over the whole surface of second interlayer dielectric 24 formed with second capacitor 35. Then, planarization such as CMP is performed until second upper electrode 30b is exposed, thereby forming third interlayer dielectric 32. Thus, third interlayer dielectric 32 and second capacitor 35, fourth interlayer dielectric 34 and fifth interlayer dielectric 36 are formed in sequence on and/or over substrate 10. Fifth interlayer dielectric 36, fourth interlayer dielectric 34, third interlayer dielectric 32 and second interlayer dielectric 24 are patterned, for example by photolithography, thereby forming trenches and via holes. Next, upper metal line 40 and a plurality of upper contacts 38a, 38b and 38c connected to upper metal line 40 are formed by embedding metal in the trenches and via holes. Hereinafter, formation of upper metal line 40 and the plurality of upper contacts 38a, 38b and 38c will be described in greater detail.

For example, after fourth interlayer dielectric 34 is formed, a contact photoresist pattern is formed on and/or over fourth interlay dielectric 34. Using the contact photoresist pattern as an etching mask, fourth interlayer dielectric 34, third interlayer dielectric 32 and second interlayer dielectric 28b are etched selectively. Accordingly, a first via hole exposing part of second lower electrode 26b, a second via hole exposing part of second upper electrode 30b, and a third via hole exposing any one of the plurality of lower contacts 16 are formed. Subsequently, first upper contact 38a, second upper contact 38b and third upper contact 38c are formed by embedding metal respectively in the first via hole, the second via hole and the third via hole. Fifth interlayer dielectric 36 is formed on and/or over fourth interlayer dielectric 34 including the plurality of upper contacts 38a, 38b and 38c. Next, fifth interlayer dielectric 36 is patterned to thereby form the trench for exposing upper contacts 38a, 38b and 38c. Metal is embedded in the trench, thereby forming upper metal line 40.

However, the above described method for forming upper contacts 38a, 38b and 38c and metal line 40 is only by way of example but does not restrict embodiments. For example, first upper contact 38a may be formed by embedding metal in the via hole formed by patterning fourth interlayer dielectric 34, third interlayer dielectric 32 and second capacitor interlayer dielectric 28b, so as to connect upper metal line 40 to second lower electrode 26b. In addition, second upper contact 38b may be formed by embedding metal in the via hole formed by patterning fourth interlayer dielectric 34, to connect upper metal line 40 to second upper electrode 30b of second capacitor 35. Also, third upper contact 38c may be formed by embedding metal in the via hole formed by patterning fourth interlayer dielectric 34, third interlayer dielectric 32 and second interlayer dielectric 24, to connect upper metal line 40 to lower contact 16 in connection with lower metal line 14. Lower contact is connected to first lower electrode 18 of first capacitor 25 through lower metal line 14. Upper metal line 40 is formed by embedding metal in the trench formed by patterning fifth interlay dielectric 36. Thus, fabrication of the stack capacitor having a first capacitor 25 including first lower electrode 18 and first upper electrode 22 and second capacitor 35 including second lower electrode 26b and second upper electrode 30b is completed.

As can be appreciated from the above description, in the stack capacitor in accordance with embodiments, first lower electrode 18 and first upper electrode 22 of first capacitor 25 are arranged vertically to second upper electrode 30b of second capacitor 35, having the same width and/or surface area with each other. Therefore, the area covering electrodes 18 and 22 of first capacitor 25 and the area covering electrode 30b of second capacitor 35 are corresponded to each other. Accordingly, the number of processes for forming the electrodes of the first capacitor 25 and second capacitor 35 in accordance with embodiments is reduced compared to other fabrication methods of electrodes of first and second capacitors requiring dedicated fabrication and application of masks for the electrodes. Consequently, the process efficiency is greatly enhanced while preventing deterioration of the capacitance.

As illustrated in example FIG. 8, semiconductor device 800 in accordance with embodiments may include substrate 10, first interlayer dielectric 12, lower metal line 14, plurality of lower contacts 16, second interlayer dielectric 24, third interlayer dielectric 32, stack capacitor 37, fourth interlayer dielectric 34, plurality of upper contacts 38a, 38b and 38c, fifth interlayer dielectric 36, and upper metal line 40. First interlayer dielectric 12 is formed on and/or over substrate 10 while lower metal line 14 and plurality of lower contacts 16 are formed within first interlayer dielectric 12. Second interlayer dielectric 24 is formed on and/or over first interlayer dielectric 12 and third interlayer dielectric 32 is formed on and/or over second interlayer dielectric 24. In accordance with embodiments, stack capacitor 37 has a laminated structure in which second capacitor 35 is deposited on and/or over and in electrical connection to first capacitor 25. First capacitor 25 may include first lower electrode 18, first capacitor dielectric layer 20, first upper electrode 22, which are deposited in sequence. Second capacitor 35 may include second lower electrode 26b, second capacitor dielectric layer 28b, and second upper electrode 30b, which are deposited in sequence. First lower electrode 18 and first upper electrode 22 of first capacitor 25 are arranged vertically to each other to have the same width and/or surface area. Alternatively, first lower electrode 18 of first capacitor 25 may be vertically arranged relative to second upper electrode 30b of second capacitor 35. In addition, first upper electrode 22 of first capacitor 25 may be arranged vertically relative to second upper electrode 30b of second capacitor 35 to have the same width and/or surface area. Accordingly, first lower electrode 18 and first upper electrode 22 of first capacitor 25, and second upper electrode 30b of second capacitor 35 can be arranged vertically to have the same width and/or surface area with respect to one another. More specifically, first capacitor 25 is formed on and/or over first interlayer dielectric 12 and second capacitor 35 is formed in third interlayer dielectric 32. Fourth interlayer dielectric 34 is formed on and/or over third interlayer dielectric 32. First lower electrode 18 of first capacitor 25 is connected to lower contacts 16 formed within first interlayer dielectric 12. First upper contact 38a of upper contacts 38a, 38b and 38c, is connected to second lower electrode 26b of second capacitor 35. Second upper contact 38b of upper contacts 38a, 38b and 38c is connected to second upper electrode 30b. A third upper contact 38c out of the plurality of upper contacts 38a, 38b and 38c is connected to any one of lower contacts 16. Fifth interlayer dielectric 36 is formed on and/or over fourth interlayer dielectric 34. Upper metal line 40 is formed in fifth interlayer dielectric 36. The respective upper contacts 38a, 38b and 38c are connected to upper metal line 40.

As described herein, the stack capacitor is structured such that electrodes 18 and 22 of first capacitor 25 and second upper electrode 30b of second capacitor 35 are vertically arranged with respect to one another, having the same width and/or surface area. Therefore, the fabrication process of the stack capacitor is facilitated, thereby preventing deterioration of the capacitance.

As apparent from the description herein, in accordance with embodiments, in a stack capacitor in a semiconductor device and a fabrication method for the same, electrodes of a first capacitor and an upper electrode of a second capacitor are vertically arranged, corresponding to each other regarding the width and/or surface area. Therefore, the fabrication of the stack capacitor can be facilitated, thereby preventing deterioration of the capacitance.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:
1. A method for fabricating a semiconductor device comprising:
forming a first capacitor including a first lower electrode, a first capacitor dielectric layer and a first upper electrode over a semiconductor substrate; and then forming a second capacitor including a second lower electrode, a second capacitor dielectric layer and a second upper electrode over the first capacitor, wherein first lower electrode, the first upper electrode and the second upper electrode are formed having the same surface area, the second lower electrode is in contact with the first upper electrode, and the second lower electrode has a greater surface area than that of the second upper electrode.

2. The method of claim 1, wherein forming the first capacitor comprises:

sequentially forming a first metal layer, a first dielectric layer, and a second metal layer over the semiconductor substrate; and then forming a first photoresist pattern over the second metal layer using a first mask; and then forming the first lower electrode, the first capacitor dielectric layer, and the first upper electrode by sequentially etching the second metal layer, the first dielectric layer, and the first metal layer using the first photoresist pattern as an etching mask.

3. The method of claim 2, wherein the first metal layer and the second metal layer comprise any one of tungsten (W), aluminum (Al), tantalum (Ta) and tantalum nitride (TaN), and the first dielectric layer comprises any one of silicon nitride (SiN) and silicon oxide ($SiO_2$).

4. The method of claim 2, wherein forming the second capacitor comprises:

sequentially forming a third metal layer, a second dielectric layer, and a fourth metal layer over the second interlayer dielectric and the first upper electrode; and then forming a second photoresist pattern over the fourth metal layer using the first mask; and then forming the second upper electrode by etching the fourth metal layer using the second photoresist pattern as an etching mask; and then forming a third photoresist pattern using a second mask; and then forming the second capacitor dielectric layer and the second lower electrode by etching the second dielectric layer and the third metal layer using the third photoresist pattern as an etching mask.

5. The method of claim 4, wherein the third metal layer and the fourth metal layer comprise any one of tungsten (W), aluminum (Al), tantalum (Ta) and tantalum nitride (TaN), and the second dielectric layer comprises any one of silicon nitride (SiN) and silicon oxide ($SiO_2$).

6. The method of claim 1, further comprising, before forming the first capacitor:

forming a lower metal line over the semiconductor substrate; and then forming a first interlayer dielectric formed over the lower metal line and exposing the lower metal line; and then forming a plurality of lower contacts extending through the first interlayer dielectric and connected to the lower metal line, wherein any one of the plurality of lower contacts is connected to the first lower electrode.

7. The method of claim 6, further comprising, after forming the first capacitor and before forming the second capacitor:

forming a second interlayer dielectric over the first interlayer dielectric and the first capacitor such that the first capacitor is exposed through the second interlayer dielectric.

8. The method of claim 7, further comprising, after forming the second capacitor:

forming a third interlayer dielectric formed over the second interlayer dielectric and the second capacitor such that the second capacitor is exposed through third interlayer dielectric; and then forming a fourth interlayer dielectric over the third interlayer dielectric and the second capacitor; and then simultaneously forming a first upper contact extending through the third interlayer dielectric, the fourth interlayer dielectric and the second capacitor dielectric layer and connected to the second lower electrode, a second upper contact extending through the fourth interlayer dielectric and connected to the second upper electrode, and a third upper contact connected to any one of the lower contacts by penetrating the fourth interlayer dielectric, the third interlayer dielectric, and the second interlayer dielectric.

9. A method comprising:

forming a lower metal line over a semiconductor substrate; and then forming a first capacitor connected to the lower metal line, the first capacitor including a first lower electrode, a first upper electrode and a first capacitor dielectric layer interposed between the first lower electrode and the first upper electrode; and then forming a second capacitor connected to the first capacitor, the second capacitor including a second lower electrode, a second upper electrode and a second capacitor dielectric layer interposed between the second lower electrode and the second upper electrode; and then simultaneously forming a first upper contact connected to the second lower electrode, a second upper contact connected to the second upper electrode, and a third upper contact connected to the lower metal line, wherein the first lower electrode, the first upper electrode and the second upper electrode are formed having the same surface area, the second lower electrode is in contact with the first upper electrode, and the second lower electrode has a greater surface area than that of the second upper electrode.

10. The method of claim 1, wherein the second capacitor dielectric layer is formed having a greater surface area than that of the second upper electrode.

* * * * *